United States Patent [19]
Onodera

[11] Patent Number: 5,608,642
[45] Date of Patent: Mar. 4, 1997

[54] COMPONENT RECOGNITION METHOD AND DEVICE

[75] Inventor: Hitoshi Onodera, Iwata, Japan

[73] Assignee: Yamaha Hatsudoki Kabushiki Kaisha, Iwata, Japan

[21] Appl. No.: 363,692

[22] Filed: Dec. 23, 1994

[30] Foreign Application Priority Data

Dec. 29, 1993 [JP] Japan .................................... 5-352710

[51] Int. Cl.⁶ ...................................................... G06F 17/00
[52] U.S. Cl. .............................. 364/478.01; 364/468.21; 364/468.28; 364/559; 29/743; 29/834
[58] Field of Search ........................... 364/559, 478, 364/468, 167.01; 29/740, 705, 706, 709, 714, 720, 721, 743, 759, 739–741, 829, 832–834, 836; 414/752, 754, 783; 250/559.24, 559.26; 356/394, 152.1, 383, 384

[56] References Cited

U.S. PATENT DOCUMENTS

| | | |
|---|---|---|
| 3,337,941 | 8/1967 | Drop . |
| 3,487,226 | 12/1969 | Yetter et al. . |
| 3,622,396 | 11/1971 | Fernandez . |
| 3,624,401 | 11/1971 | Stoller . |
| 3,876,877 | 4/1975 | Meulensteen et al. . |
| 4,092,719 | 5/1978 | Salmon . |
| 4,144,449 | 3/1979 | Funk et al. . |
| 4,151,945 | 5/1979 | Ragard et al. . |
| 4,247,767 | 1/1981 | O'Brien et al. . |
| 4,346,293 | 8/1982 | Fetzer . |
| 4,383,359 | 5/1983 | Suzuki et al. . |
| 4,615,093 | 10/1986 | Tews et al. . |
| 4,745,295 | 5/1988 | Seno et al. ........................ 250/559.26 |
| 4,790,069 | 12/1988 | Maruyama et al. . |
| 4,805,110 | 2/1989 | Takahashi et al. . |
| 4,858,308 | 8/1989 | Komori ................................ 29/740 |
| 5,060,366 | 10/1991 | Asai et al. . |
| 5,088,187 | 2/1992 | Takata et al. ......................... 29/705 |
| 5,377,405 | 1/1995 | Sakurai et al. ........................ 29/833 |
| 5,384,956 | 1/1995 | Sakurai et al. ........................ 29/834 |

FOREIGN PATENT DOCUMENTS

| | | |
|---|---|---|
| 416878A1 | 3/1991 | European Pat. Off. . |
| 471272A1 | 2/1992 | European Pat. Off. . |
| 2834836 | 6/1979 | Germany . |
| 9214988 | 9/1992 | WIPO . |

*Primary Examiner*—Roy N. Envall, Jr.
*Assistant Examiner*—Steven R. Garland
*Attorney, Agent, or Firm*—Knobbe, Martens, Olson & Bear LLP

[57] ABSTRACT

The invention is a method of determining whether a pick up apparatus has picked up a component in a normal manner. The method includes picking up a component with the apparatus, detecting at least one dimension of a projected image with of the component with an optical detector and determining whether the component has been picked up normally by determining whether the dimension of said projected image, less a correction factor based on the diffraction of light, is within a tolerance range.

93 Claims, 9 Drawing Sheets

COMPONENT RECOGNITION METHOD AND DEVICE

BACKGROUND OF THE INVENTION

This invention relates to an attracting nozzle control apparatus for a chip mounting machine and, more particularly, to an improved method of detecting when components are properly picked up by the apparatus.

There are a wide variety of applications wherein components are picked up from a feed section where they are delivered and moved to and placed at an accurate location. A wide variety of devices are employed for actually picking up the components. Frequently such pick-up devices employ vacuum nozzles for picking up the components.

A specific application for this type of apparatus and method is in the making of printed circuit boards. With such printed circuit boards, it is common to employ a device called a "chip mounter" that picks up small components such as integrated circuits, resistors or capacitors at a feed section and places them on a printed circuit board. Vacuum nozzles are frequently employed as the pick-up devices.

The criticality for accurately mounting such components is readily apparent. However, in the process of mounting the nozzle, mistakes may be made even if the apparatus functions automatically and these mistakes can result in inaccurate mounting of the components and other problems.

In addition to the problems of pick-up misorientation, frequently it is possible that the pick-up device will pick up the component not only at an orientation other than desired but the component actually picked up in a manner which is "not normal" (i.e., a manner which will not permit the component to be reoriented into a position which will allow it to be mounted on an accurate location on a substrate). For example, the component normally has a lower surface that is intended to be positioned on the device in which it is to be mounted such as a printed circuit board or the like. However, if the component is picked up off center it may actually rotate from the normal orientation so that the surface that is to be mounted will not be facing downwardly. If an attempt is made to mount the component in this orientation, damage can result. If, however, separate measurements need be taken both to determine the orientation of the article as picked up and also whether the article has been picked up in a normal manner, the speed of the machine can be slowed considerably.

The copending application of the inventor hereof entitled "Method for Mounting Components and Apparatus Therefor," Ser. No. 08/103 358 filed Aug. 9, 1993 and assigned to the Assignee hereof, which is hereby incorporated herein by reference, discloses a method for determining when a pickup which is not normal has occurred without the need for additional measurements being taken.

Specifically, the application discloses a method in which the component is recognized as not having been picked up in a normal manner if the determined minimum length of the component is less than the length of the shorter side of the component times one minus a safety factor, or if the minimum length is greater than the length of the longer side of the component times one plus a safety factor. An additional calculation is likewise disclosed to address situations where the minimum length of the component is not substantially greater than the thickness of the component.

While the foregoing method was a significant advance and is successful in identifying cases where components are not picked up in a normal manner, there are limitations to the accuracy of the foregoing method due to limits in the accuracy of the determination of the minimum length of the component.

SUMMARY OF THE INVENTION

A first feature of the invention is adapted to be embodied in a component handling apparatus for accurately picking up and positioning components which comprises a pick up portion. A sensing station is provided that is adapted to recognize the orientation of the component as picked up by the pick up portion. Means are provided for determining from the recognition both the orientation of the component relative to the pick up portion and if the component as picked up is oriented so that it can be positioned properly wherein it is determined if a component as picked up can be positioned properly. This later determination is made by taking a measurement of one dimension of the component, applying a correction factor based on the known error of the sensing station from the measurement to determine a calculated dimension and comparing the calculated dimension with a known value of the dimension. It is determined that the object has been picked up in a manner which is not normal if the comparison is not approximately equal.

A further feature of the invention is a component handling apparatus for positioning components comprising a pick up portion adapted to pick up a component. A sensing portion and means for moving said pick up portion and a picked up component into the sensing portion are also provided. Means are provided in the sensing portion for determining the length of said component as picked up in one coordinate of a three dimensional coordinate system, applying the known error of the sensing portion to the determined length to determine a calculated length, comparing the calculated length to a selected one of the dimensions of the object and determining that the object has been picked up in a manner which is not normal if the comparison is not approximately equal.

A still further aspect of the invention is embodied in a method for determining whether an apparatus for accurately positioning components using a pick up portion has picked up the component in a manner which is not normal. The method comprises the steps of recognizing the orientation of the component as picked up by the pick up portion, and determining from the recognition both the orientation of the component relative to the pick up portion and if the component as picked up is oriented so that it can be positioned properly. The determination as to whether the component is picked up so that it can be positioned properly is determined by taking a measurement of one dimension of the component, applying the known error of the recognition to the measurement to determine a calculated dimension and comparing the calculated dimension with a known value of the dimension and determining that the object has been picked up in a manner which is not normal if the comparison is not approximately equal.

A still further feature of the invention is adapted to be embodied in a method for positioning components with an apparatus comprising a pick up portion adapted to pick up a component, a sensing portion, means for moving said pick up portion and a picked up component into the sensing portion. The method comprises the steps of determining with the sensing portion the length of the component as picked up in one coordinate of a three dimensional coordinate system, applying the known error of the sensing portion to the measured length to determine a calculated length, comparing the calculated length to a selected one of the dimensions of the object and determining that the object has been picked up in a manner which is not normal if the comparison is not approximately equal.

DETAILED DESCRIPTION OF THE PREFERRED EMBODIMENT OF THE INVENTION

The invention includes an improved method and apparatus which provides for the more precise determination as to when a component is picked up in a manner which is not normal. This both decreases waste and avoids machine down time through the attempted mounting of improperly picked-up components.

In a typical arrangement, the apparatus determines whether the component has been picked up in a proper manner by means of optical detection. Such a means will usually include a laser unit located below a head unit including a light emitting section for emitting parallel light beams within a certain plane and a light receiving section opposing the light emitting section.

As discussed in greater detail below and in the aforementioned copending application Ser. No. 08/103,358, whether the chip is mounted in a normal manner is determined by measuring the minimum projected length of the chip component by checking the projected length while rotating the chip component and comparing the minimum length with a reference value. Importantly, however, the light beams cast on the chip components located between the light emitting section of the optical detector and the light receiving section of the optical detector are not truly parallel. Specifically, the light beams undergo diffraction and interference, and tend to diffuse over the distance from the chip component to the light receiving section. As a result, the minimum value of the projected length is somewhat larger than the actual length of the shorter side of the chip component even if the chip component has been picked up correctly.

Thus, it is difficult to determine with great accuracy whether the chip component has been picked up correctly solely by relying on the minimum projected length of the component. This limitation can be compensated for, however, by increasing the tolerance range to ensure that the minimum projected length of a correctly picked up chip will fall within the tolerance range despite the aforementioned phenomenon. On the other hand, if the tolerance range is wide and the size of the chip component is very small, the projected minimum length of the chip component may fall within the tolerance range even if the chip component is picked up incorrectly.

Figure 1:
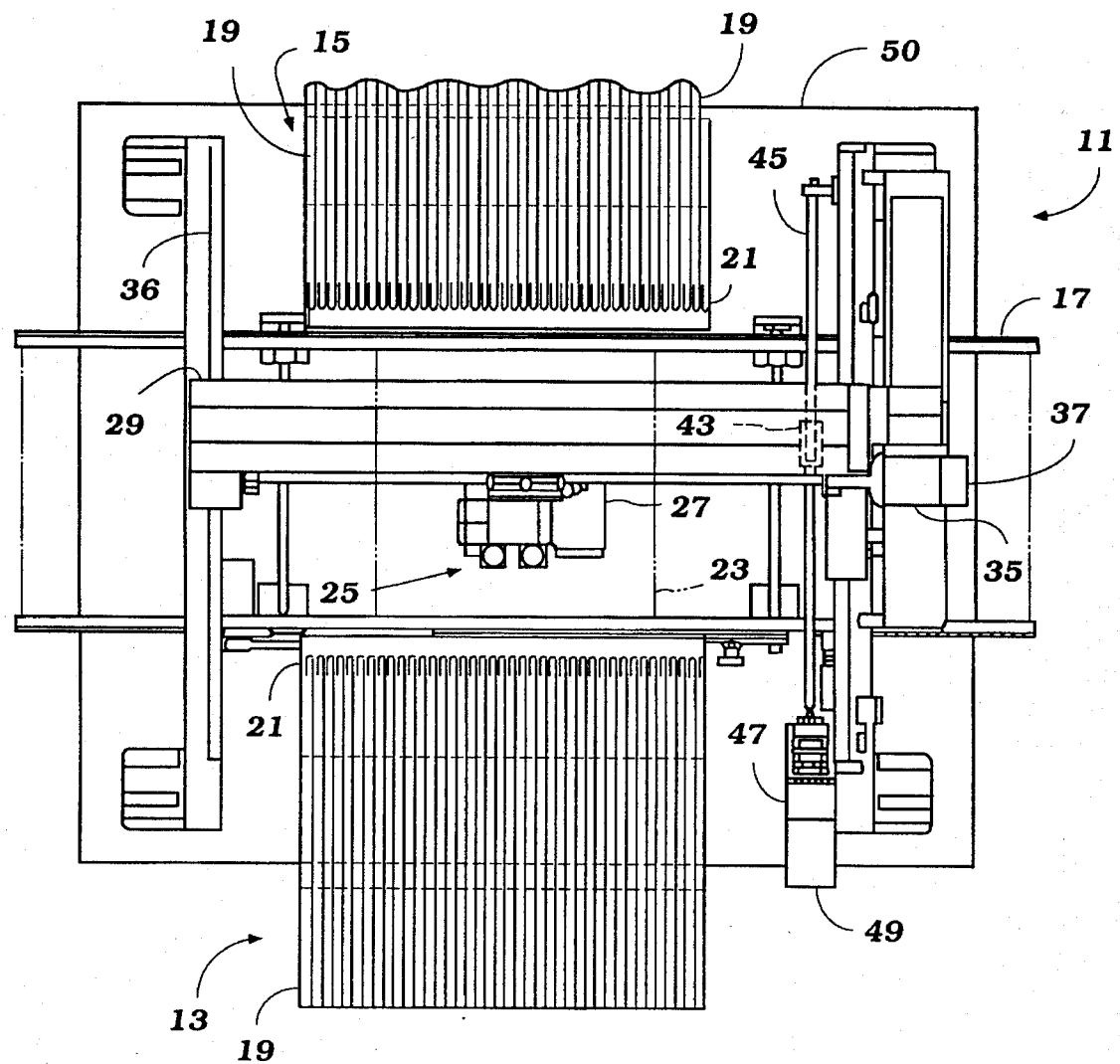
FIG. 1 is a top plan view of a component mounting apparatus constructed in accordance with an embodiment of the invention.
Figure 2:
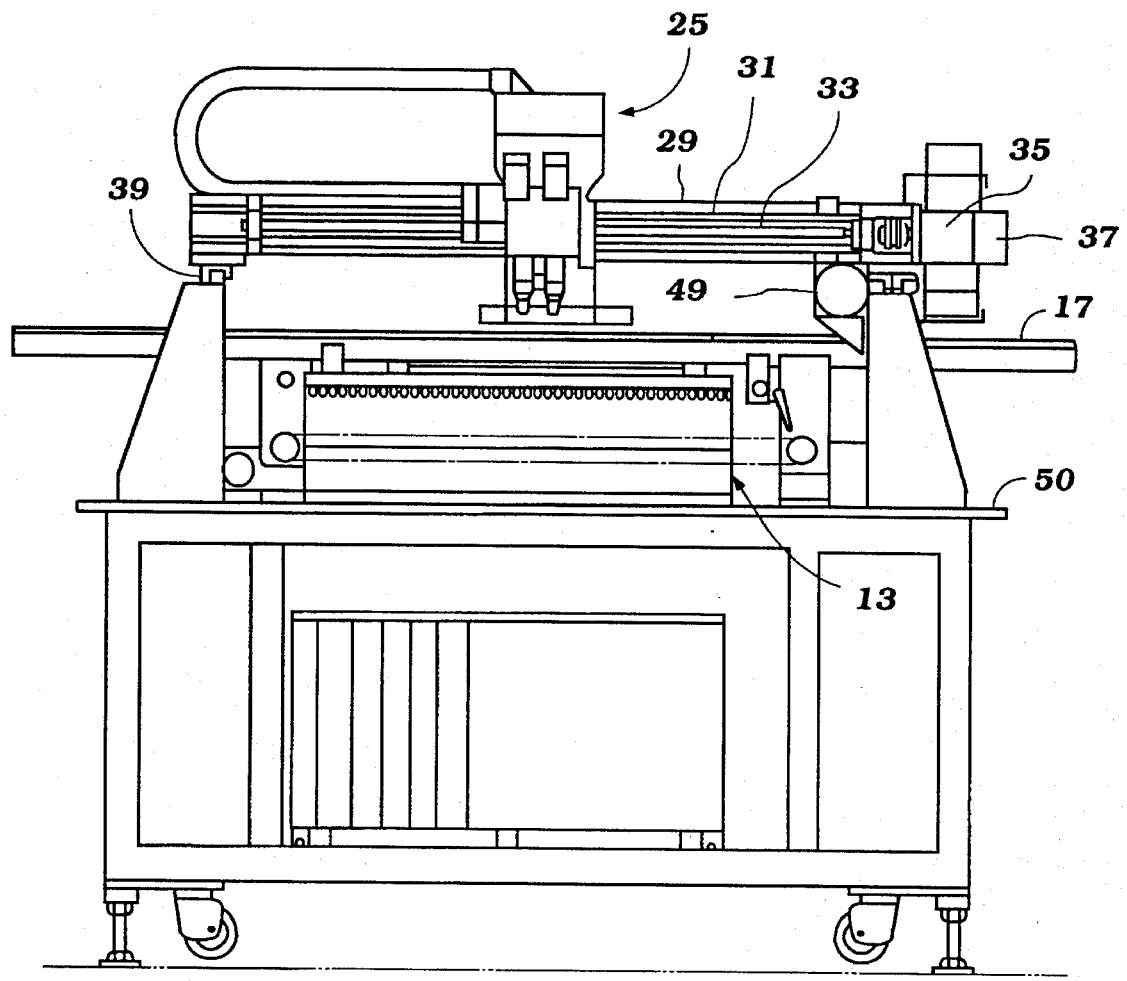
FIG. 2 is a front elevational view of the component mounting apparatus of FIG. 1.

Referring now in detail to the drawings and initially to FIGS. 1 and 2, a component mounting apparatus constructed and operated in accordance with the preferred embodiment of the invention is identified generally by the reference numeral 11. Other than certain control features of the apparatus 11, this apparatus is identical to the apparatus disclosed in the aforementioned co-pending application Ser. No. 08/103,358. It will be appreciated, however, that the method disclosed herein is a preferred method and that variations from the method are possible without varying from the principles of the present invention. For example, the method may be based on a maximum projected dimension. Furthermore, it will be appreciated that the method of the present invention can be practiced with a different apparatus than disclosed herein.

The apparatus 11 is adapted to mount small components such as integrated circuits, resistors, capacitors or the like which are supplied at respective delivery stations 13 and 15 disposed on opposite sides of a conveyor assembly 17. The delivery stations 13 and 15 comprise a plurality of individual feeders 19 each having a component delivery end 21, each of the type comprising a roll of tape having pockets in which components to be mounted are contained. These tapes are advanced by a ratchet mechanism under a control as is well known.

The conveyor 17 selectively presents a substrate, indicated at 23, to a mounting area positioned between the delivery stations 13 and 15. A pick-up and recognition device, indicated generally by the reference numeral 25, is mounted for movement in an X-Y plane so as to selectively pick up components from the feeders 19 and 21 and position them on the substrate 23 at the desired location. In addition, the pick-up and recognition device 25 cooperates so as to provide an indication of the orientation of the components picked up thereby so as to adjust for their mounting position, as will be described.

The pick-up and recognition device 25 includes a mounting head 27 which is mounted for movement along a carriage 29 by means of guide rails 31 and a driving feed screw 33. The feed screw 33 has a recirculating ball nut in connection with the mounting head 27 so that upon rotation of the feed screw 33, the mounting head 27 will move in the X axis direction.

An X axis drive motor 35 is mounted at one end of the carriage 29 and is coupled to the feed screw 33 for driving in clockwise or counter clockwise directions so as to appropriately position the mounting head 29. An encoder 37 is coupled to the X axis drive motor 35 and provides a X coordinate positional signal to a control apparatus as shown in the block diagram of FIG. 4.

The carriage 29 is mounted for movement in the Y direction on a pair of guide rails 39 which are disposed at opposite sides of an area where the substrate or printed circuit boards 23 are disposed and outwardly of the ends of the feeder sections 13 and 15. It will be appreciated that this arrangement permits movement of the carriage 29 along the guide rails 39.

Figure 4:
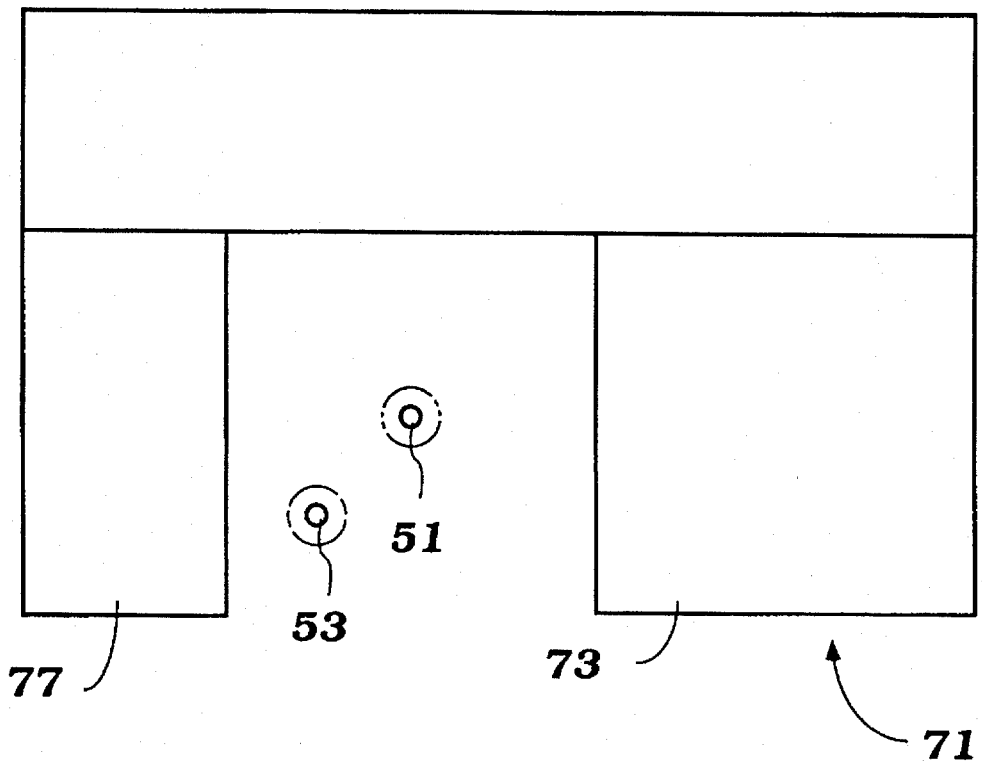
FIG. 4 is a top plan view illustrating the pick-up nozzles- and detection system of the invention.
Figure 4:
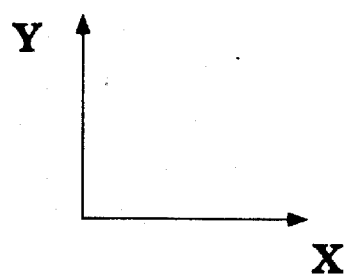

The carriage 29 is provided with a recirculating ball nut 43 which is engaged with a feed screw 45 that is journaled on one of the guide rails 39. This feed screw 45 is driven by a reversible electric motor 47 so as to move the carriage 29 and mounting head 27 in the Y direction. An encoder 49 is coupled to the Y-axis drive motor 47 and, as shown in FIG. 4, provides an output signal indicative of the Y coordinate position of the mounting head 27.

The entire assembly as thus far described may be mounted conveniently on a table 50 so that the apparatus can be moved from location to location, but can also be retained in position.

Figure 3:
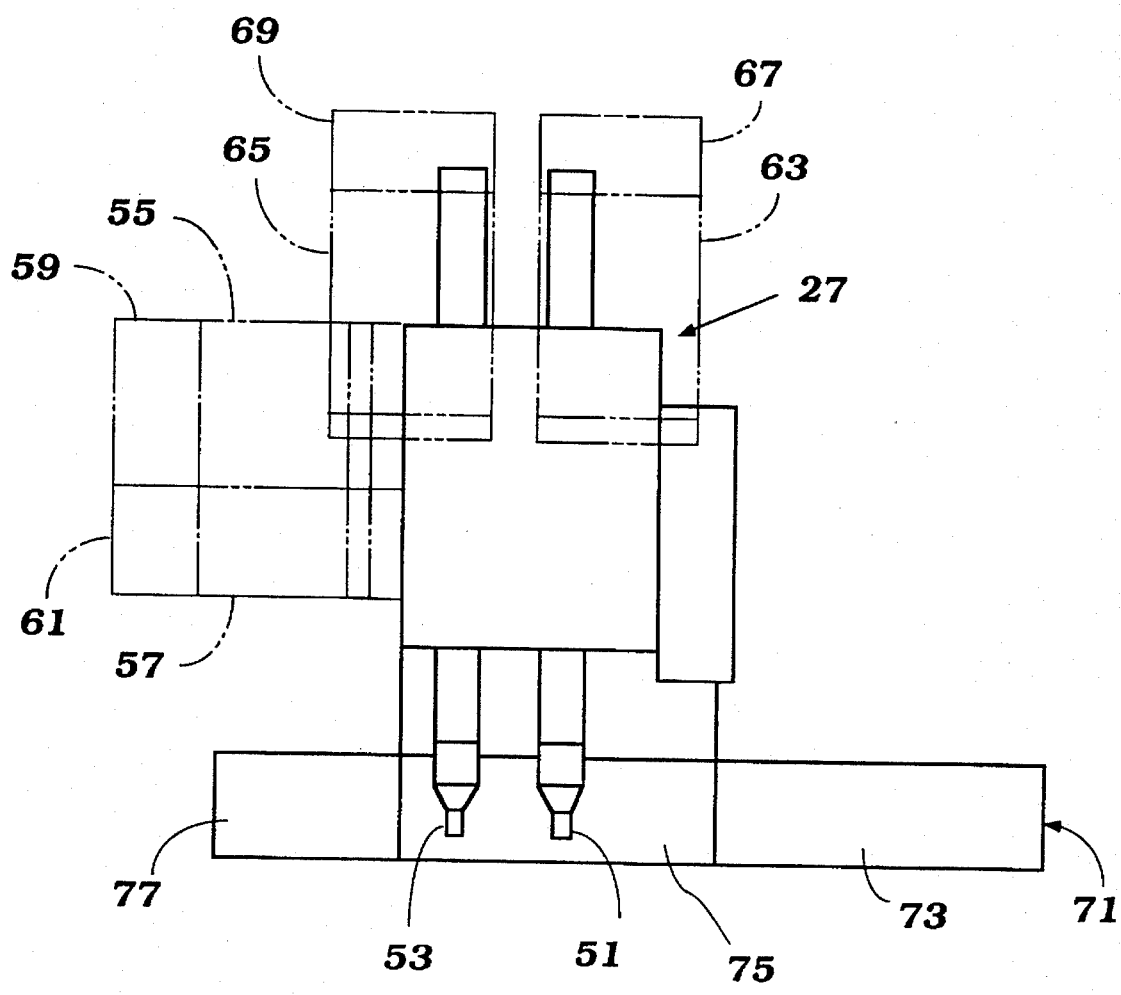
FIG. 3 is an enlarged front elevational view showing the detecting station of FIG. 1.

The construction of the pick-up and recognition device will now be made with reference to FIG. 3. Referring to FIG. 3, it should be noted that the mounting head carries, in this embodiment, two pick-up nozzles indicated by the reference numerals 51 and 53. The pick-up nozzles 51 and 53 are of the vacuum type, but it should be readily apparent to those skilled in the art that the invention can be employed with other types of pick-up nozzles. Reference is made to the co-pending application filed in the name of Hiroshi Sakurai, et al., entitled "Method for Mounting Components and an Apparatus Therefor," Ser. No. 08/086,512, filed Jul. 1, 1993, now issued as U.S. Pat. No. 5,377,405 on Jan. 3, 1995 and assigned to the assignee hereof for a more detailed description of how plural pick-up nozzles may be mounted on a single mounting head. The disclosure of that application is hereby incorporated by reference.

Figure 5:
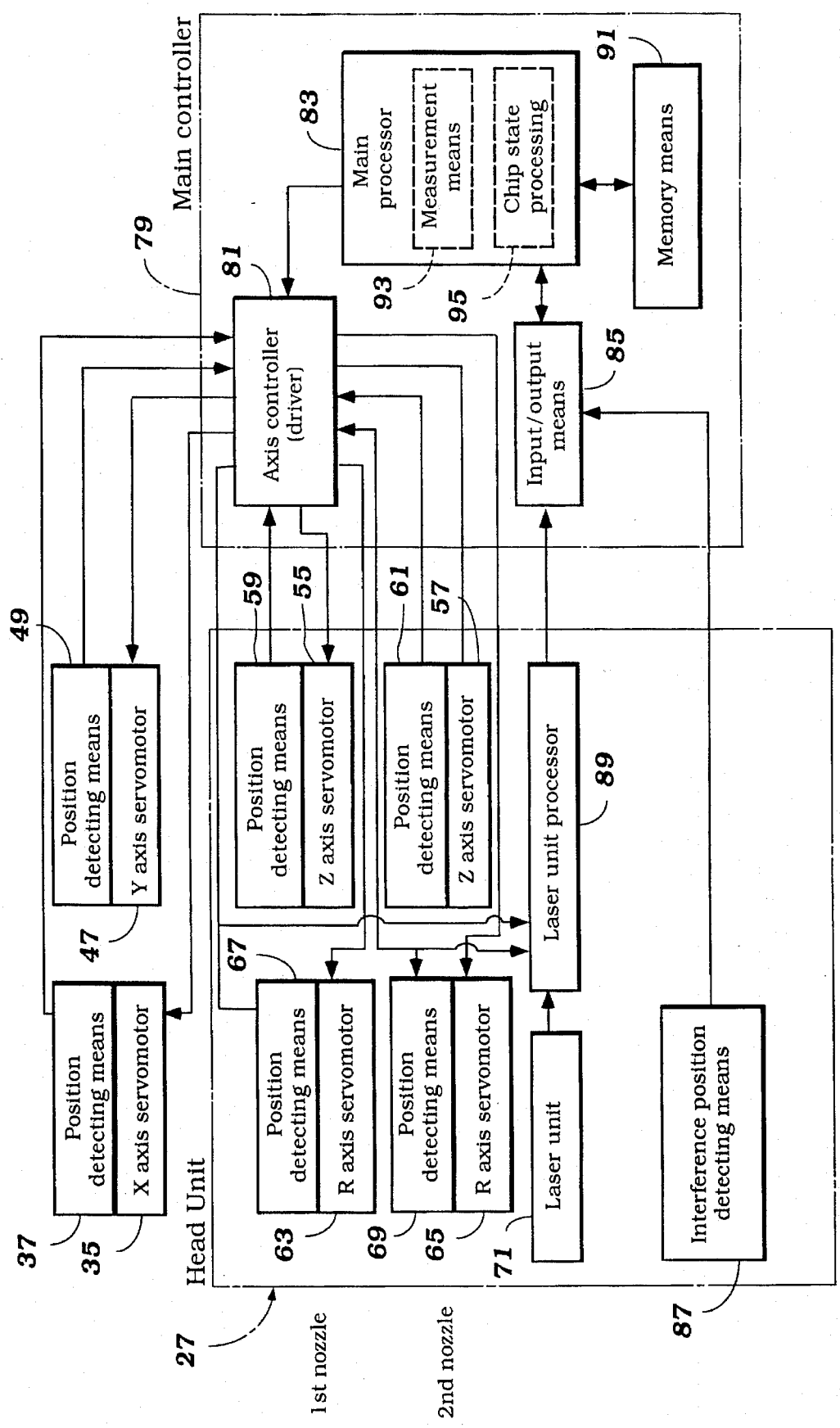
FIG. 5 is a block diagram showing the inter-relationship between various apparatus components.

Briefly summarized, each of the pick-up nozzles 51 and 53 is mounted for movement in a vertical direction along a Z axis by the mounting head 27 and is driven for movement in such direction by respective Z axis servo motors 55 and 57. Encoders 59 and 61 are coupled to the drive motors 55 and 57, respectively, so as to provide an output signal indicative of the Z coordinate position of the respective nozzles 51 and 53, as shown in FIG. 5.

In addition, the nozzles 51 and 53 are also supported for rotation about respective vertical R-axes. Rotational movement about these axes is obtained by R axis servo motors 63 and 65, which are coupled to nozzles 51 and 53, respectively, for effecting rotary movement. Encoders 67 and 69 are connected to the motors 63 and 65, respectively, and provide output signals indicative of the angular position about the rotational R-axis. Again, the relationship of these components is shown in FIG. 5.

The mounting head 27 of the pick-up and recognition device 25 also detects the position of components which are picked up by the pick-up nozzles 51 and 53, so as to make correction factors for misalignment of their pick-up position so that when they are positioned on the substrate 23 they will be positioned in an accurate location.

The pick-up and recognition device also insures that the position of the components after being picked up is detected to enable correction factors for misalignment from an ideal position to be calculated to enable them to be positioned in an accurate location. Specifically, the pick-up and recognition device 25 includes a sensor or detector 71, which is described as being of the optical type. This detector includes a light source, such as a laser light source 73 that emits generally straight light rays across a gap 75 in which the pick-up nozzles may be positioned and which casts shadows on a receptor 77 of the capacitor coupled (CCD) type. As best seen in FIG. 4, to permit simultaneous recognition and measurement of components carried by each of the pick-up nozzles without interference, these nozzles are staggered relative to the gap 75.

The first pick-up nozzle 51 is located at the approximate center of the gap while the second pick-up nozzle 53 is located obliquely behind the first pick-up nozzle 53. This arrangement is particularly adapted in situations where the apparatus will selectively use either the first pick-up nozzle 51 or both pick-up nozzles 51 and 53 depending on the size of the chip component. When the chip component is relatively large, only the first pick-up nozzle 51 is used to pick up the chip component. On the other hand, when the chip components are relatively small, both pick-up nozzles 51 and 53 are used to pick up the chip components.

FIG. 5 illustrates the apparatus schematically for purposes of illustrating the inter-relationship of the components for control purposes. The apparatus includes a main controller 79 which has an axis controller or drive unit 81 which controls the operation of the X-axis servo motor 35, the Y-axis servo motor 47 and the Z-axis servo motors 55 and 57, associated with the first and second pick-up nozzles 51 and 53, respectively. This axis controller 81 also receives back signals from various encoders or position detectors 35, 47, 55, 57, 63 and 65 associated with the aforenoted servo motors.

The axis controller receives its signals from a main processor 83 so as to effect the movement in accordance with the procedures which will be described herein and also the procedures described in each of the aforementioned co-pending applications. As discussed above, the head unit further includes an interference position detecting means 87 to determine whether the pick-up nozzles 51 and 53 are at a height which will permit movement of the head unit 27 without interference. Likewise, the head unit further includes a laser unit processor 89. Both the interference position detecting means 87 and the laser unit processor 89 are connected to the main processor 83 by means of the input/output means 85. The main processor 83 further includes a memory means 91 for storing the estimated value of the difference or error between the measured projected length of the component and the actual length of the shorter side of the component. The main processor 83 further includes measurement means 93 for measuring the minimum length of the shorter side of the chip component by examining the projected length detected by the laser unit 71 while rotating the chip component at the component recognition position, and chip state processing means 95 for determining whether the picked-up state of the chip component is normal by comparing the length of the chip component's shorter side, calculated from the chip component length measured by the measurement means 93 and the correction amount read out of the memory means 91, with a reference value of the length of the shorter side of the chip component.

Figure 6:
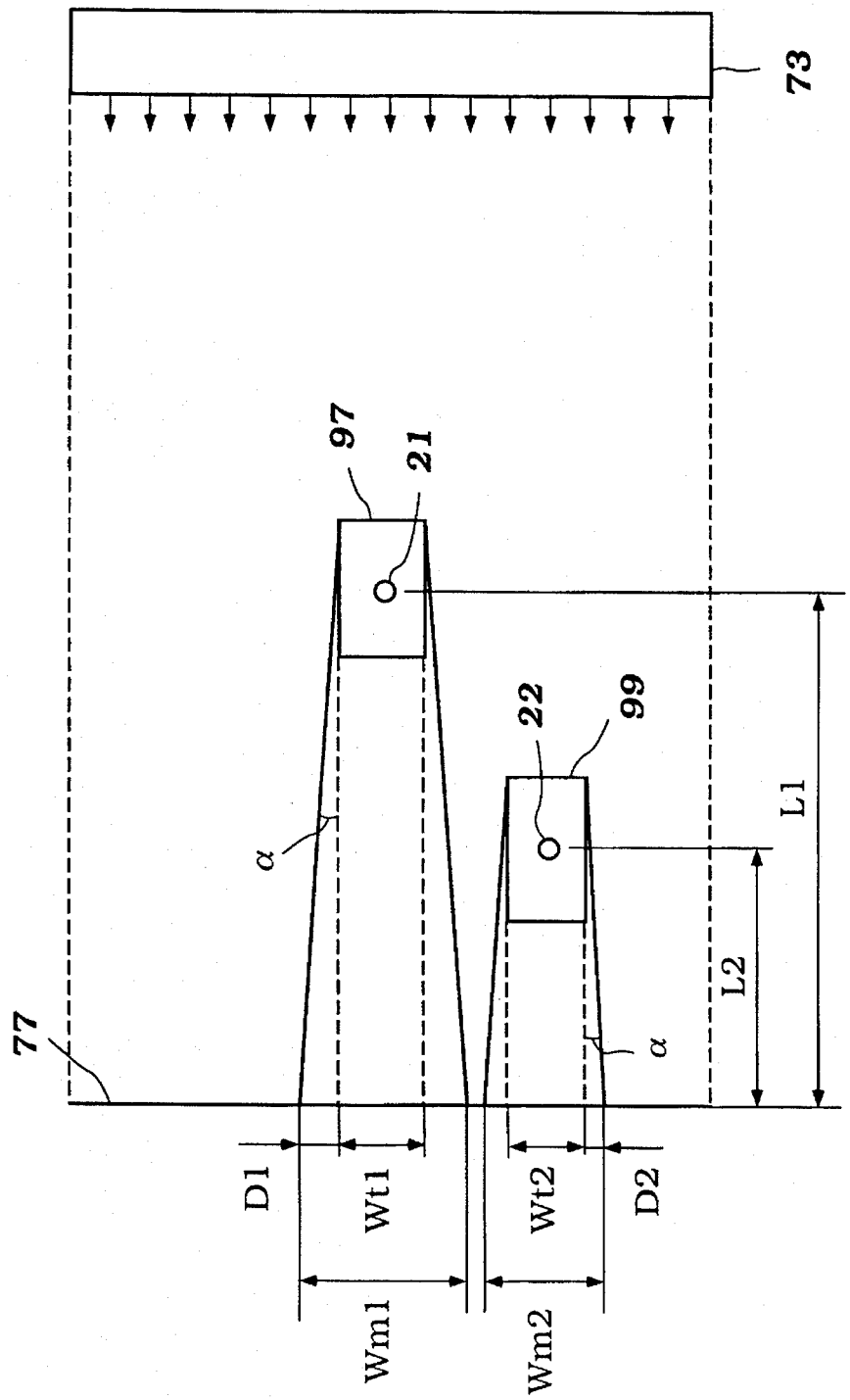
FIG. 6 is a schematic view illustrating the manner in which the measurements of the error factor are obtained by the detecting apparatus.

A preferred method of determining when a component has been picked up in a manner which is not normal will now be described with reference to FIGS. 6–9. Referring to FIG. 6, the determination is made by utilizing an estimated value of projected length error based on the diffusion angle of the light beams and the distance of the chip component picked up by the pick-up nozzle and the laser light detector. This error is then subtracted from a measured projected length to determine a calculated length of the shorter side of the component Wt compared to a reference value for the length of the component's shorter side. If this calculated length of the shorter side Wt is not approximately equal to a known minimum length of the shorter side of the component, the program determines that the component has been picked up incorrectly (i.e., in a manner which is not normal).

The aforementioned projected length error arises when the parallel light beams cast from the laser light source 73 into the gap 75 strike the chip component 97 picked up by the first pick-up nozzle 51, they are diffused over the distance from the chip component 97 to the laser light detector 77 by a constant angle $\alpha$. Where the distance between the corner closest to the laser light detector 77 of the chip component held by the first pick-up nozzle 51 is L1, the light diffusion amount D1 at the laser light detector 77 is:

$$D1 = L1 \times \cos\alpha \quad (1)$$

Thus, the difference $\Delta W1$ between the minimum projected length of the shorter side of the component Wm1 and the actual minimum length of the shorter side of the component Wt1 is:

$$\Delta W1 = 2 \times D1 = 2 \times L1 \cos\alpha \quad (2)$$

Similarly, when parallel light beams emitted from the laser light source 73 strike the closest edge of the component 99 picked up by the second nozzle 53, they are diffused by the identical diffusion angle $\alpha$. Thus, assuming the distance from the corner closest the laser light source to the laser light detector 77 is L2, the light diffusion amount D2 at the laser light source 73 is:

$$D2 = L2 \times \cos\alpha \quad (3)$$

Therefore, the different $\Delta W2$ between the projected minimum length of the shorter side of the component Wm2 and the actual length Wt2 of the shorter side of the component 99 picked up by the second pick-up nozzle 53 is:

$$\Delta W2 = 2 \times D2 = 2 \times L2 \cos\alpha \quad (4)$$

In view of the above equation, the diffusion angle $\alpha$ and the distances L1 and L2 (approximately the distance from the pick-up nozzle to the light receiving section) are obtained in advance. Using those values and the equations two and four, the projected length correction amounts $\Delta W1$ and $\Delta W2$ are obtained for the pick-up nozzles 51 and 53, and stored in the memory means 91.

Figure 7:
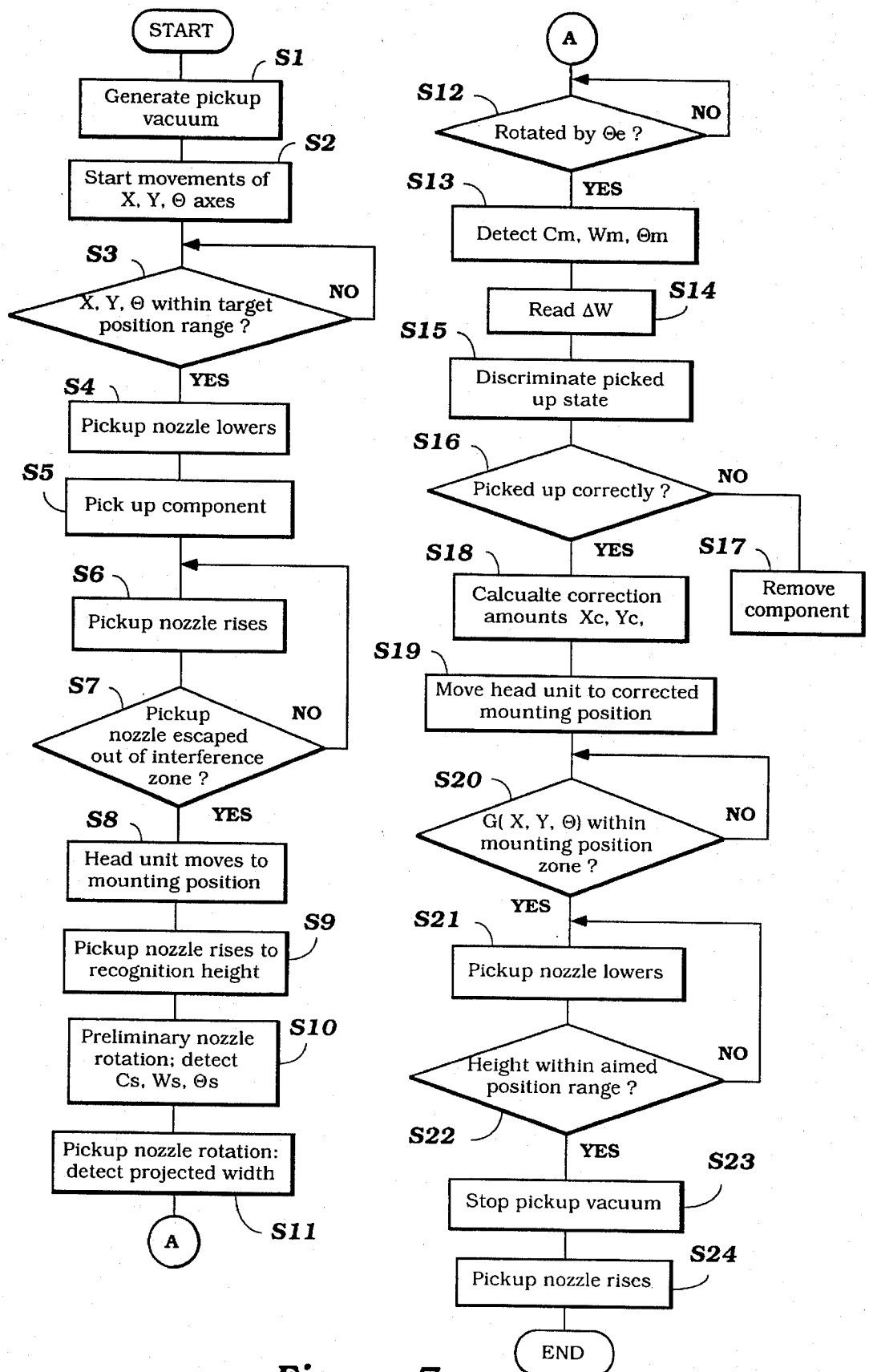
FIG. 7 is a block diagram showing the control routine in accordance with the method of the present invention.

How this projected length error is used to determine whether a component has been picked up in a manner which is not normal will now be discussed with reference to FIG. 7. The block diagram of FIG. 7 shows the process followed by a pick-up nozzle from a point just prior to a component being picked up to the point the component is mounted. This process is identical to the process described in the aforementioned co-pending application Ser. No. 08/103,358, with the exception of Steps 15–17. Furthermore, while the flow chart shows the process for a single pick-up nozzle, when both pick-up nozzles 51 and 53 are used, the same process for pick-up, recognition and mounting is carried out in parallel.

As indicated in FIG. 7, once the process is initiated, in step S1, a vacuum is applied to the pick-up nozzle from a vacuum source (not shown). Thereafter, in step 2, the servo motors are driven to move the nozzle in the appropriate X, Y and $\theta$ direction toward the pick-up location. In step 3, a determination is made as to whether the coordinates X, Y and $\theta$ for the pick-up nozzle center have reached an intended position range. If not, the program continues to ask the question until the coordinates for the pick-up nozzle center fall within the intended position range. Once this position is reached, the pick-up nozzle lowers, as indicated in step S4, the chip component is picked up from an individual feeder (step S5) and the pick-up nozzle is raised (step S6).

Next, in step S7, a determination is made as to whether the pick-up nozzle has risen to a position out of the zone of interference with the delivery station. If not, the program cycles to the beginning of step S6 so that the pick-up nozzle is raised further. If, on the other hand, the pick-up nozzle has escaped from the interference zone, the head moves to the mounting position (step S8). During this movement to the mounting position, the pick-up nozzle is further raised to the recognition height at step S9. This component recognition height is a position where the component held by the pick-up nozzle is positioned between the laser light source 73 and the laser light detector 77, within the gap 75.

Once the nozzle 51 and specifically the picked up component K are positioned in the detecting position of the sensor 71, the detecting and checking procedure begins. First, the pick-up nozzle is rotated in one direction to a certain angular position $\theta_s$, for reasons which will be described below. The pick up nozzle 51 is then rotated in the opposite direction to the projected length $W_s$ of the shorter side of the component on the receptor by determining the area of the receptor 77 that is shaded, the offset of the center of this area from a reference position $W_s$ and the rotated angular position $\theta_s$ of the pick up nozzle which is known from the information derived from the encoder 67 of the R axis servo motor 63. This is all done at the step S10.

It should be noted that the components K will only be roughly positioned in the openings of the feeder tape. The reason for this is it is not practical to make the opening the exact size of the components K because then they would be difficult to extract from the openings. Also, the end 21 of the feeder sections 19 may not be accurately positioned and the tape may not be accurately fed. Thus, it is necessary to determine both the angular offset about the center of rotation of the pick up nozzle 51 and the offsets in the X and Y axis in order to determine how the component K has been picked up so that it can be accurately positioned on the circuit board 23. By determining the offset, it is possible to calculate correction factors $X_c$, $Y_c$ and $\theta_c$ to compensate for this in the mounting position when the feeder nozzle 51 is finally positioned over the circuit board 23 for mounting, as will be described. Basically this operation involves rotating the nozzle 51 and component K through a predetermined angle is which the minimum length condition has been reached, an angle, as will be described, and measuring the projected length of the component during this rotation as may be seen diagrammatically in FIG. 8. This rotation step is depicted as the step S11 in FIG. 7.

The program then moves to the step S12 to determine if the pick up nozzle 51 and component K have been rotated through a predetermined angle in which the minimum length condition has been reached, the angle $\theta_e$. If therefore the angle $\theta_e$ has not yet been reached, the rotation is completed. If, however, the rotation is completed then the program moves to the step S13 so as to calculate the minimum projected length ($W_m$) of the shorter side of the component, offset in the point at which the nozzle has picked up the component ($C_m$), and the angle of rotation ($\theta_m$) at which the minimum length condition existed.

The method of measuring the location of pick up of the component K and the method with which the apparatus detects whether the component has been picked up in a normal manner will now be described in addition by reference to FIG. 8. As previously noted, the components K will be only roughly positioned at the pick up station 19 where the pick up has occurred. Hence, the center of the pick up nozzle O will probably be displaced from the center G of the component K. The angular position $\theta$ will also vary about the rotational axis R.

In order to insure that the component is in a position other than its minimum length position when initially picked up, once pick up has been accomplished, as has been noted the component is rotated so that it will be rotated clockwise through an angle $\theta_s$ from the initial angular position as determined by an arbitrary line M drawn through the center of the nozzle O which constitutes the ($\theta=0$) position.

Hence, this initial rotation through the angle $\theta_s$ will position the component K in the angle $\theta_s$ so that when the light is emitted from the light source 73 to the light sensitive receptor 77, an area indicated as $W_s$ which is equal to the length of the component K in a plane parallel to the R axis of the pick up nozzle 51 will be occluded. When this measurement is taken, the center G of the component K will be displaced at a distance $C_s$ from a line L which forms the perimeter at one side of the measurement apparatus.

As noted, the pick up nozzle 51 is then rotated in an opposite direction at the step S11 from the previous clockwise rotation through a position where the minimum projected length $W_m$ of the shorter side of the component is measured. At this point, it will be possible to determine the location of the center G at the mid point of $W_m$ and hence at a distance $C_m$ from the line L. The rotation continues until a rotation through the predetermined angle $\theta_e$ has occurred as previously noted as determined at the step S13. The specific angle $\theta_e$ does not have to be a large angle and 45° is an appropriate angle so as to insure that the $W_m$ condition can be met.

Once the angular measurement necessary to determine the minimum length $\theta_m$ of the shorter side of the component from the position $\theta_s$ has been determined and the length at the minimum length position $W_m$ and the initial length $W_s$ have been measured, it will then be possible to determine the actual position of the pick up nozzle O relative to the center G of the component K both in the X and Y planes and also the angular relationship $\theta$ so as to determine the necessary correction factors in order to place the component K at the desired location and orientation on the substrate 23 to which it is to be mounted.

Figure 9A:
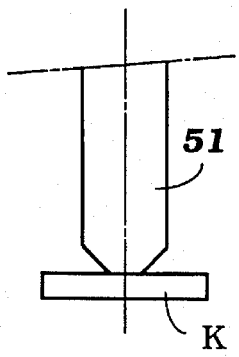
FIGS. 9(a), 9(b) and 9(c) are side elevational views of the relationship of the pick-up nozzle to a picked-up component and show either a correct pick-up (FIG. 9(a)) or various forms of an incorrect pick-up (FIGS. 9(b) and 9(c)).
Figure 9B:
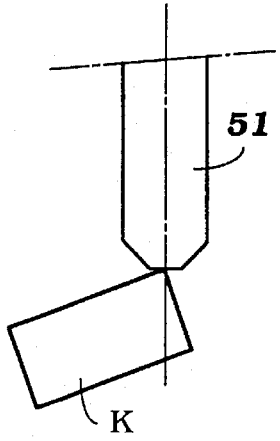
Figure 9C:
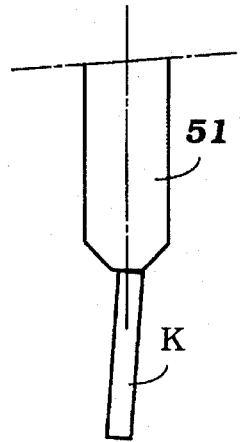

Before these calculations are performed, however, the apparatus determines whether the component K has been picked up in a normal manner in accordance with the improved method of the present invention. FIG. 9(a) shows a normal attraction of the component K while FIGS. 9(b) and 9(c) show abnormal attractions. As may be seen in FIG. 9(b), a pick up has occurred close to the edge of the component K and as a result, when the nozzle 51 is raised, the component K can slip so that its top edge rather than its side edge is exposed. Alternatively and as shown in FIG. 9(c), the component may actually slip so that a side edge is attracted by the pick up nozzle 51 rather than the top surface thereof.

After $W_m$, $C_m$ and $\theta_m$ have been determined in Step S13, a projected length correction amount $\Delta W$ for the particular pick-up nozzle is read from the memory means 91 (step S14). As discussed above, this correction mount $\Delta W$ will be different for different nozzles due to the differences between the distance between the nozzle and the laser light detector 77. It will be further recognized that the distance between the center point of the subject nozzle and the laser light detector is an approximation of the distance between the corners of the chip component distal the laser light detector and the laser light detector.

As discussed above, the minimum projected length $W_m$ ($W_{m1}$ or $W_{m2}$ in FIG. 6) is larger than the actual component length $W_t$ by the amount of error in the projected length. Therefore, the component length $W_t$ is determined by subtracting the projected length correction amount $\Delta W$ ($\Delta W_1$ or $\Delta W_2$ in FIG. 5) corresponding to the projected length error from the minimum projected length $W_m$ ($W_t = W_m - \Delta W$). Again, the component length $W_t$ corresponds to the length of the shorter side of the component if the component is picked up correctly.

Once the component length $W_t$ is determined, it is checked to determine whether it is within the tolerance range which is an established shorter side length plus or minus a certain safety factor $\delta$ at the step 515.

The pick-up is also determined to be incorrect if the projected length does not become a minimum somewhere in the course of the rotation. Thus, mathematically, if any of the following four equations are met, the program determines in step S16 that the pick-up is incorrect.

$$W_t < \text{(length component's shorter side)} \times (1-\delta) \quad (5)$$

$$W_t > \text{(length of component's longer side)} \times (1+\delta) \quad (6)$$

where $\delta$ is a safety factor.

$$\theta_m = \theta_s \quad (7)$$

$$\theta_m = \theta_e \quad (8)$$

If the component has not been correctly picked up based on the determination at the step S16, the program proceeds to step S17 and discards the component.

If, on the other hand, the program determines in step S16 that the component has been picked up correctly, the program proceeds to step S18 and calculates the corrections amounts necessary to properly mount the component. These calculations may be best understood by reference to FIG. 8 which shows in phantom lines the $\theta_s$ position of the component K and in solid lines its minimum length position. In this arrangement, the correction factors $Y_c$ and $\theta_c$ are easily determined in accordance with the following relationships:

$$Y_c = C_m - C_N$$

$$\theta_c = \theta_m$$

Figure 8:
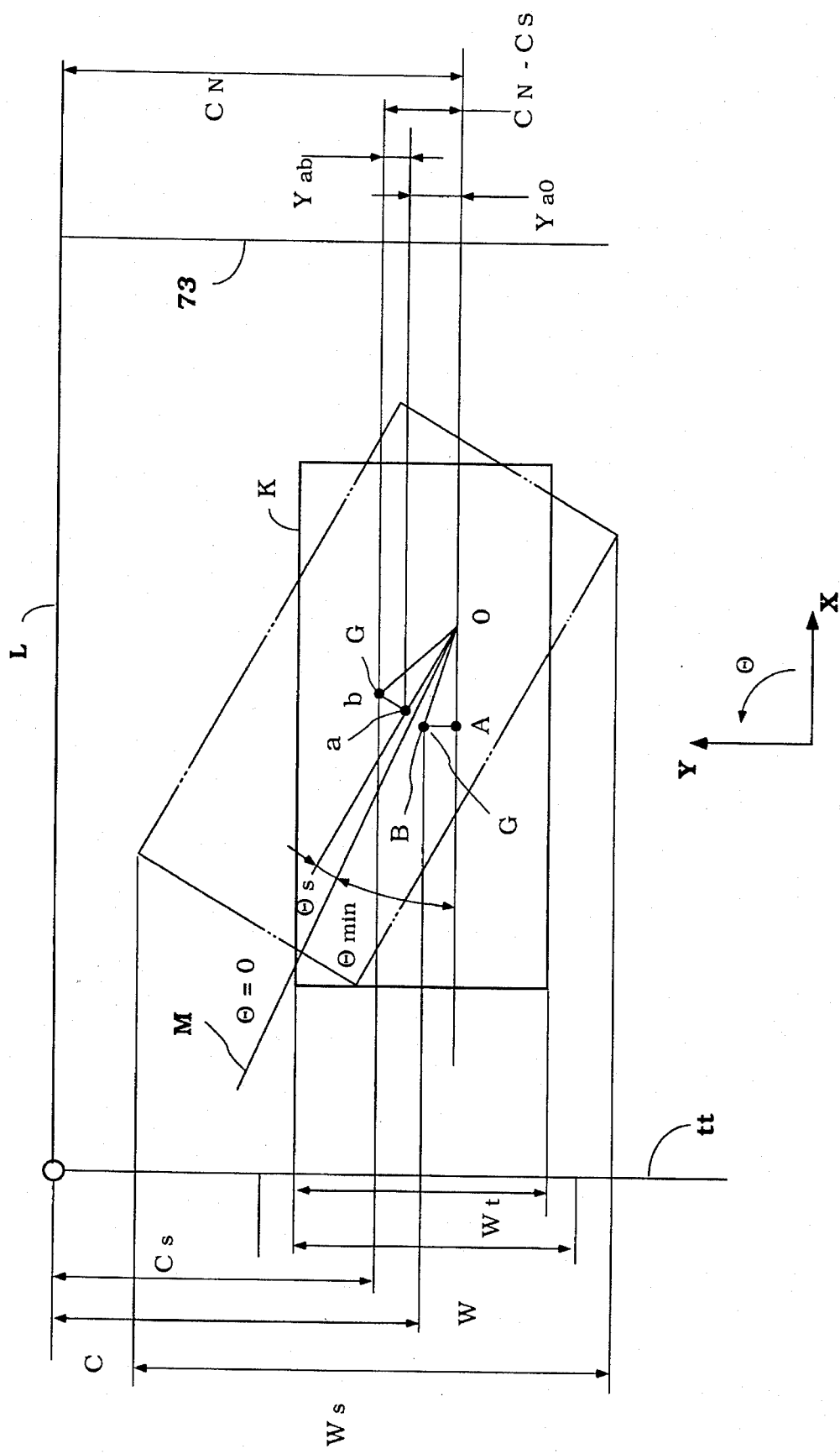
FIG. 8 is a schematic drawing of a chip component state and projected length at the time of component recognition.

In these equations, $C_N$ is distance of the center position O of the attracting nozzle 51, as shown in FIG. 8 from the edge of the measurement to the nozzle center which will be constant under all angular rotations of the component K. Hence, $C_N$ is a known factor and thus $Y_c$ is easily calculated since $C_m$ is easily calculated. Hence, the correction amounts $Y_c$ and $\theta_c$ are values that are obtained substantially by actual measurement and no real calculation is required.

The value of $X_c$ however does require calculations using the data $C_s$, $\theta_s$, $C_m$ and $\theta_m$ obtained by the detected figures. The basis for these calculations are as follows and again reference is made to FIG. 8.

We know that AOB=aOb. Thus, a b=AB=$C_N - C_m$. Thus the projected length $W_{ab}$ of the side a b on the Y axis (the plane of measurement) can be determined from the following relationship:

$$Y_{ab} = (C_N - C_m)\cos(\theta_m + \theta_s)$$

Similarly, the projected length $Y_{ao}$ of the side "a o" on the measurement plane of the Y axis is obtained by the following equation:

$$\begin{aligned} Y_{ao} &= a\,o\,\sin(\theta_m + \theta_s) \\ &= (C_N - C_s) - Y_{ab} \\ &= (C_N - C_s) - (C_N - C_m)\cos(\theta_m + \theta_s) \end{aligned}$$

Therefore, the correction amount $X_c$ and the X axis direction can be calculated from the above equation by the following equation:

$$X_c = AO = aO = \frac{(C_N - C_s) - (C_N - C_m)\cos(\theta_m + \theta_s)}{\sin(\theta_m + \theta_s)}$$

The method of making this calculation is described in more detail on the copending application entitled METHOD FOR MOUNTING COMPONENTS AND AN APPARATUS THEREFOR, filed in my name and the names of Hiroshi Sakurai and Horoyuki Ohta, Ser. No. 08/073,741, filed Jun. 8, 1993, now issued as U.S. Pat. No. 5,384,956 on Jan. 31, 1995, which application is assigned to the assignee hereof, the disclosure of which is incorporated herein by reference.

Once these correction mounts are determined, the head is moved in step S19 to the corrected mounting position. That is, the mounting position called for by the program corrected by the $X_c$, $Y_c$ and $\theta_c$ corrections aforenoted. The program then proceeds to step S20, where it determines whether the actual position of the pick-up nozzle is within the mounting position zone on the printed circuit board. If not, the program repeats, and the inquiry is repeated until it is answered in the affirmative. Once the determination is made that the components are within the mounting zone, the program proceeds to step S21 and the pick-up nozzle is lowered.

The program then proceeds to step S22, where the program determines whether the height of the nozzle is within the desired position range. If not, the program cycles back before step S21 and the pick-up nozzle is further lowered, and the inquiry repeated. On the other hand, if the height of the pick-up nozzle is within the desired height range, the program proceeds to step S23, and the pick-up vacuum is stopped and the chip component is mounted on the printed circuit board. Thereafter, the program proceeds to step S24 and raises the pick-up nozzle, at which this subroutine of the control process ends.

As will be appreciated, the method of the present invention permits the apparatus to determine whether the component has been picked up in a normal manner with a higher accuracy than previously possible by prior art methods. Due to the high level precision, the safety factor $\delta$ can be made very small, thereby ensuring that components which are picked up in a manner which is not normal are not mounted.

The method and device of this invention are not limited to the above embodiment or method, but various changes may be made without departing from the spirit and scope of this invention. For example, the number of pick-up nozzles provided on the head unit 27 may be greater or less than two. In that case, if the distance from the pick-up nozzle to the laser light detector 77 of the laser unit 71 is different for each nozzle, the estimated value of the projected length error due to light diffusion may be obtained for each nozzle and stored as the correction amount in the memory section 91, for each nozzle.

I claim:

1. A component handling apparatus for accurately positioning components, said apparatus comprising a pick up portion for picking up and positioning a component, a sensing station for recognizing the orientation of said component as picked up by said pick up portion, and means for determining from the recognition both the orientation of the component relative to the pick up portion and if the component as picked up normally so that the component is oriented so that it can be positioned properly, said determination if a component as picked up can be positioned properly being made by taking a measurement of one dimension of the component, applying a correction factor based on a known error of said sensing station from said measurement of said one dimension to determine a calculated dimension and comparing the calculated dimension with a known value of the dimension and determining that the component has been picked up in a manner which is not normal if the comparison is not approximately equal.

2. A component handling apparatus as set forth in claim 1, wherein said sensing station comprises an optical detector and the known error is based on the diffraction of light.

3. A component handling apparatus as set forth in claim 2, wherein the orientation of the component relative to the pick up portion is determined by taking certain measurements of the component and applying those measurements to determine a correction amount when the component is deposited.

4. A component handling apparatus set forth in claim 3, wherein the pick up portion is rotatable about a rotational axis R and moveable along X, Y and Z axes from a pick up station to a deposit station, the sensing station measures the projected length of the component in a plane parallel to the axis of rotation of the pick up portion includes means for measuring the projected length of the component in the plane at two angular rotations and measuring the angular rotation between the two measured positions for determining the place where the component has been picked up by the pick up portion.

5. A component handling apparatus as set forth in claim 4, wherein the component is rotated to a second position wherein the projected length in the plane is at an extreme of the projected length in the plane.

6. A component handling apparatus set forth in claim 5, wherein the projected length in the second position is the narrowest length.

7. A component handling apparatus as set forth in claim 4, wherein the components are only roughly oriented at the pick up station.

8. A component handling apparatus as set forth in claim 7, wherein the component is rotated to an initial angular position prior to the measurement.

9. A component handling apparatus as set forth in claim 8, wherein the initial rotation is in a direction opposite from the direction of rotation from the first position to the second position.

10. A component handling apparatus as set forth in claim 8, wherein the component is rotated to the initial position prior to the beginning of measurements and when the component is initially picked up.

11. A component handling apparatus as set forth in claim 4, wherein the offset of the center of the component from the center of the pick up portion in the X, Y and angular planes are determined.

12. A component handling apparatus as set forth in claim 11, wherein the calculations are made by trigonometric relationships.

13. A component handling apparatus as set forth in claim 12, wherein the component is rotated to a second position wherein the projected length in the plane is at an extreme of the projected length in the plane.

14. A component handling apparatus as set forth in claim 13, wherein the projected length in the second position is the narrowest length.

15. A component handling apparatus as set forth in claim 14, wherein the components are only roughly oriented at the pick up station.

16. A component handling apparatus as set forth in claim 15, wherein the component is rotated to an initial angular position prior to the measurement.

17. A component handling apparatus as set forth in claim 16, wherein the initial rotation is in a direction opposite from the direction of rotation from the first position to the second position.

18. A component handling apparatus as set forth in claim 17, wherein the component is rotated to the initial position prior to the beginning of measurements and when the component is initially picked up.

19. A component handling apparatus as set forth in claim 4, wherein the sensing station comprises a light source and a photoelectric receptor positioned in the plane.

20. An apparatus as set forth in claim 2, further comprising means for calculating said correction factor based on the distance between said component and said sensing station and the angle of diffraction of light.

21. An apparatus as set forth in claim 20, wherein said apparatus further comprises a plurality of pick up portions each cooperable with the sensing station, further comprising memory means for storing correction factors for each of said plurality of pick up portions.

22. A component handling apparatus as set forth in claim 21, wherein the orientation of the component relative to the pick up portion is determined by taking certain measurements of the component and applying those measurements to determine a correction amount when the component is deposited.

23. A component handling apparatus set forth in claim 22, wherein the pick up portion is rotatable about a rotation axis R and moveable along X, Y and Z axes from a pick up station to a deposit station, the sensing station measures the projected length of the component in a plane parallel to the axis of rotation of the pick up portion includes means for measuring the projected length of the component in the plane at two angular rotations and measuring the angular rotation between the two measured positions for determining the place where the component has been picked up by the pick up portion.

24. A component handling apparatus as set forth in claim 23, wherein the component is rotated to a second position wherein the projected length in the plan is at an extreme of the projected length in the plane.

25. A component handling apparatus set forth in claim 24, wherein the projected length in the second position is the narrowest length.

26. A component handling apparatus set forth in claim 23, wherein the components are only roughly oriented at the pick up station.

27. A component handling apparatus as set forth in claim 26, wherein the component is rotated to an initial angular position prior to the measurement.

28. A component handling apparatus as set forth in claim 27, wherein the initial rotation is in a direction opposite from the direction of rotation from the first position to the second position.

29. A component handling apparatus as set forth in claim 27, wherein the component is rotated to the initial position prior to the beginning of measurements and when the component is initially picked up.

30. A component handling apparatus as set forth in claim 23, wherein the offset of the center of the component from the center of the pick up portion in the X, Y and angular planes are determined.

31. A component handling apparatus as set forth in claim 30, wherein the calculation are made by trigonometric relationships.

32. A component handling apparatus as set forth in claim 31, wherein the component is rotated to a second position wherein the projected length in the plane is at an extreme of the projected length in the plane.

33. A component handling apparatus as set forth in claim 32, wherein the projected length in the second position is the narrowest length.

34. A component handling apparatus as set forth in claim 33, wherein the components are only roughly oriented at the pick up station.

35. A component handling apparatus as set forth in claim 34, wherein the component is rotated to an initial angular position prior to the measurement.

36. A component handling apparatus as set forth in claim 35, wherein the initial rotation is in a direction opposite from the direction of rotation from the first position to the second position.

37. A component handling apparatus as set forth in claim 35, wherein the component is rotated to the initial position prior to the beginning of measurements and when the component is initially picked up.

38. A component handling apparatus for positioning components, said apparatus comprising a pick up portion adapted to pick up a component, a sensing portion, means for moving said pick up portion and a picked up component into said sensing portion, means in said sensing portion for determining the length of said component as picked up in one coordinate of a three dimensional coordinate system, applying a correction factor based on a known error of the sensing portion to the determined length to determine a calculated length, comparing the calculated length to a selected one of the dimensions of the component and determining that the component has been picked up in a manner which is not normal if the comparison is not approximately equal.

39. A component handling apparatus as set forth in claim 38, wherein said sensing portion comprises an optical detector and the known error is based on the diffraction of light.

40. A component handling apparatus as set forth in claim 39, wherein the pick up portion is rotated about a rotational axis R, and the measuring station measures the projected length of the component in a plane parallel to the axis of rotation of the pick up portion at two angular positions and measures the angular rotation between the two measured positions for determining the length of the component.

41. An apparatus as set forth in claim 40, wherein the component is rotated to a second position wherein the projected length in the plane is at an extreme of the projected length in the plane.

42. An apparatus as set forth in claim 41, wherein the projected length in the second position is the narrowest length.

43. An apparatus as set forth in claim 42, wherein the component is rotated to an initial angular position prior to the measurement.

44. An apparatus as set forth in claim 43, wherein the initial rotation is in a direction opposite from the direction of rotation from the first position to the second position.

45. An apparatus as set forth in claim 44, wherein the calculations are made by trigonometric relationships.

46. An apparatus as set forth in claim 39, further comprising means for calculating said correction factor based on the distance between said component and said sensing station and the angle of diffraction of light.

47. An apparatus as set forth in claim 46, wherein said apparatus further comprises a plurality of pick up portions each cooperable with the sensing station, further comprising memory means for storing correction factors for each of said plurality of members.

48. A component handling apparatus as set forth in claim 47, wherein the pick up portion is rotated about a rotational axis R, and the measuring station measures the projected length of the component in a plane parallel to the axis of rotation of the pick up portion at two angular positions and measures the angular rotation between the two measured positions for determining the length of the component.

49. An apparatus as set forth in claim 48, wherein the component is rotated to a second position wherein the projected length in the plane is at an extreme of the projected length in the plane.

50. An apparatus as set forth in claim 49, wherein the component is rotated to an initial angular position prior to the measurement.

51. An apparatus as set forth in claim 48, wherein the projected length in the second position is the narrowest length.

52. An apparatus as set forth in claim 51, wherein the initial rotation is in a direction opposite from the direction of rotation from the first position to the second position.

53. A component handling method for accurately positioning components using a pick up portion for picking up and positioning the component comprising the steps of recognizing the orientation of the component as picked up by the pick up portion, and determining from the recognition both the orientation of the component relative to the pick up portion and if the component as picked up is oriented so that it can be positioned properly where said determination as to if the component is picked up normally so that the component is oriented so that it can be positioned properly is determined by taking a measurement of one dimension of the component, applying the known error of the recognition to the measurement to determine a calculated dimension and comparing the calculated dimension with a known value of the dimension and determining that the component has been picked up in a manner which is not normal if the comparison is not approximately equal.

54. The method as set forth in claim 53, wherein said apparatus includes a plurality of pick up portions of staggered orientation, further comprising calculating a separate correction factor for each of said plurality of pick up portions.

55. A component handling method as set forth in claim 53 wherein the orientation of the component relative to the pick up portion is determined by taking certain measurements of the component and applying those measurements to determine a correction amount when the component is deposited.

56. A component handling method set forth in claim 55 wherein the pick up portion is rotatable about a rotational axis R and moveable along X, Y and Z axes from a pick up station to a deposit station, the measurement measures the projected length of the component in a plane parallel to the axis of rotation of the pick up portion at two angular rotations and measuring the angular rotation between the two measured positions for determining the place where the component has been picked up by the pick up portion.

57. A component handling method as set forth in claim 56 wherein the component is rotated to a second position wherein the projected length in the plane is at an extreme of the projected length in the plane.

58. A component handling method set forth in claim 57 wherein the projected length in the second position is the narrowest length.

59. A component handling method set forth in claim 56 wherein the components are only roughly oriented at the pick up station.

60. A component handling method as set forth in claim 59 wherein the component is rotated to an initial angular position prior to the measurement.

61. A component handling method as set forth in claim 60 wherein the initial rotation is in a direction opposite from the direction of rotation from the first position to the second position.

62. A component handling method as set forth in claim 60 wherein the component is rotated to the initial position prior to the beginning of measurements and when the component is initially picked up.

63. A component handling method as set forth in claim 56 wherein the offset of the center of the component from the center of the pick up portion in the X and Y planes and angular portions about the R axis are determined.

64. A component handling method as set forth in claim 63 wherein the calculations are made by trigonometric relationships.

65. A component handling method as set forth in claim 64 wherein the component is rotated to a second position wherein the projected length in the plane is at an extreme of the projected length in the plane.

66. A component handling method as set forth in claim 65 wherein the projected length in the second position is the narrowest length.

67. A component handling method as set forth in claim 66 wherein the components are only roughly oriented at the pick up station.

68. A component handling method as set forth in claim 67 wherein the component is rotated to an initial angular position prior to the measurement.

69. A component handling method as set forth in claim 68 wherein the initial rotation is in a direction opposite from the direction of rotation from the first position to the second position.

70. A component handling method as set forth in claim 69 wherein the component is rotated to the initial position prior to the beginning of measurements and when the component is initially picked up.

71. A component handling method as set forth in claim 70 wherein the measurements are made by an optical sensor comprising a light source and a photo-electric receptor positioned in the plane.

72. A component handling method as set forth in claim 56 further including detecting if a component picked up by the pick up portion is correctly picked up by rotating the article in the sensing station.

73. A component handling apparatus as set forth in claim 53, wherein the measurement is taken optically and the applied known error is based on the diffraction of light.

74. A component handling method as set forth in claim 73 wherein the orientation of the component relative to the pick up portion is determined by taking certain measurements of the component and applying those measurements to determine a correction amount when the component is deposited.

75. A component handling method set forth in claim 74 wherein the pick up portion is rotatable about a rotational axis R and moveable along X, Y and Z axes from a pick up station to a deposit station, the measurement measures the projected length of the component in a plane parallel to the axis of rotation of the pick up portion at two angular rotations and measuring the angular rotation between the two measured positions for determining the place where the component has been picked up by the pick up portion.

76. A component handling method as set forth in claim 75 wherein the component is rotated to a second position wherein the projected length in the plane is at an extreme of the projected length in the plane.

77. A component handling method set forth in claim 76 wherein the projected length in the second position is the narrowest length.

78. A component handling method for positioning components with an apparatus comprising a pick up portion adapted to pick up a component, a sensing portion, means for moving said pick up portion and a picked up component into said sensing portion, said method comprising determining with the sensing portion the length of the component as picked up in one coordinate of a three dimensional coordinate system, applying a correction factor based on a known error of the sensing portion to determine a calculated length, comparing the calculated length to a selected one of the dimensions of the object and determining that the object has been picked up in a manner which is not normal if the comparison is not approximately equal.

79. The method as set forth in claim 78, wherein said apparatus includes a plurality of pick up portions each cooperable with the sensing station, each of said plurality of pick up portions of staggered orientation, further comprising calculating a separate correction factor for each of said plurality of members.

80. A component handling method as set forth in claim 78 wherein the pick up portion is rotated about a rotational axis R the projected length of the component in a plane parallel to the axis of rotation of the pick up portion at two angular positions is measured as is the angular rotation between the two measured positions for determining the length of the component.

81. A method as set forth in claim 80 wherein the component is rotated to a second position wherein the projected length in the plane is at an extreme of the projected length in the plane.

82. A method as set forth in claim 81 wherein the projected length in the second position is the narrowest length.

83. A method as set forth in claim 82 wherein the component is rotated to an initial angular position prior to the measurement.

84. A method as set forth in claim 83 wherein the initial rotation is in a direction opposite from the direction of rotation from the first position to the second position.

85. A method as set forth in claim 84 wherein the calculations are made by trigonometric relationships.

86. A component handling method as set forth in claim 78, wherein the length is determined optically and the known error is based on the diffraction of light.

87. A component handling method as set forth in claim 86 wherein the pick up portion is rotated about a rotational axis R the projected length of the component in a plane parallel to the axis of rotation of the pick up portion at two angular positions is measured as is the angular rotation between the two measured positions for determining the length of the component.

88. A method as set forth in claim 87 wherein the component is rotated to a second position wherein the projected length in the plane is at an extreme of the projected length in the plane.

89. A method as set forth in claim 88 wherein the projected length in the second position is the narrowest length.

90. A method as set forth in claim 89 wherein the initial rotation is in a direction opposite from the direction of rotation from the first position to the second position.

91. A method as set forth in claim 90 wherein the calculations are made by trigonometric relationships.

92. A method as set forth in claim 88 wherein the component is rotated to an initial angular position prior to the measurement.

93. The method as set forth in claim 86, wherein said apparatus includes a plurality of pick up portions, each of said plurality of pick up portions of staggered orientation, further comprising calculating a separate correction factor for each of said plurality of members.

* * * * *